US009520846B2

(12) United States Patent
Miri Lavasani et al.

(10) Patent No.: US 9,520,846 B2
(45) Date of Patent: Dec. 13, 2016

(54) CURRENT-DRIVEN BASEBAND FILTER WITH REDUCED ADJACENT CHANNEL LEAKAGE RATIO (ACLR)

(71) Applicant: QUALCOMM Incorporated, San Diego, CA (US)

(72) Inventors: Seyed Hossein Miri Lavasani, Santa Clara, CA (US); Cheng-Han Wang, San Jose, CA (US); Abbas Komijani, Mountain View, CA (US); Mohammad Bagher Vahid Far, San Jose, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/711,194

(22) Filed: May 13, 2015

(65) Prior Publication Data

US 2016/0336910 A1 Nov. 17, 2016

(51) Int. Cl.

*H03F 1/22* (2006.01)
*H03F 3/19* (2006.01)
*H03F 1/02* (2006.01)

(52) U.S. Cl.

CPC .............. *H03F 3/19* (2013.01); *H03F 1/0205* (2013.01); *H03F 2200/294* (2013.01); *H03F 2200/451* (2013.01)

(58) Field of Classification Search

CPC ........................................................ H03F 1/22
USPC .................................................. 330/310, 311
See application file for complete search history.

(56) References Cited

U.S. PATENT DOCUMENTS 6,496,074 B1 * 12/2002 Sowlati ................... H03F 1/223 330/311
8,120,426 B1 2/2012 Granger-Jones et al.
8,294,520 B2 * 10/2012 Borremans ............. H03F 1/223 330/294
8,294,523 B2 * 10/2012 Thomas .................... H03F 1/22 330/136
8,643,432 B1 2/2014 Chan et al.
2014/0266460 A1 9/2014 Nobbe et al.

OTHER PUBLICATIONS

Akbari M., et al., "High Performance Folded Cascode OTA using Positive Feedback and Recycling Structure," Analog Integrated Circuits and Signal Processing, vol. 82 (1), 2015, pp. 217-227.

Li S.C., et al., "Dual Gain Mode Folded-Cascode (DGMFC) Front-End for LTE 4G Handset Receiver," Future Wireless Networks and Information Systems, Lecture Notes in Electrical Engineering, vol. 143, 2012, pp. 729-737.

* cited by examiner

*Primary Examiner* — Henry Choe
(74) *Attorney, Agent, or Firm* — Patterson & Sheridan, L.L.P.

(57) ABSTRACT

Certain aspects of the present disclosure provide methods and apparatus for processing an input signal. One example apparatus is a circuit that generally includes an amplifier, comprising a first transistor and a second transistor connected in cascode with the first transistor; a buffer coupled to an output of the amplifier and configured to provide feedback to the amplifier; and a current source coupled to the second transistor and incorporated into a loop of the feedback to the amplifier.

18 Claims, 6 Drawing Sheets

400
418
V+
V+
412
Mp
410
414
408
MP2
ZP2
420
M1
430
406
Rin
428
M2
MN2
426
422
404
424

CURRENT-DRIVEN BASEBAND FILTER WITH REDUCED ADJACENT CHANNEL LEAKAGE RATIO (ACLR)

TECHNICAL FIELD

Certain aspects of the present disclosure generally relate to radio frequency (RF) circuits and, more particularly, to decreasing adjacent channel leakage ratio (ACLR) and non-linearity of a current-driven baseband filter.

BACKGROUND

Wireless communication networks are widely deployed to provide various communication services such as telephony, video, data, messaging, broadcasts, and so on. Such networks, which are usually multiple access networks, support communications for multiple users by sharing the available network resources. For example, one network may be a 3G (the third generation of mobile phone standards and technology) system, which may provide network service via any one of various 3G radio access technologies (RATs) including EVDO (Evolution-Data Optimized), 1×RTT (1 times Radio Transmission Technology, or simply 1×), W-CDMA (Wideband Code Division Multiple Access), UMTS-TDD (Universal Mobile Telecommunications System—Time Division Duplexing), HSPA (High Speed Packet Access), GPRS (General Packet Radio Service), or EDGE (Enhanced Data rates for Global Evolution). The 3G network is a wide area cellular telephone network that evolved to incorporate high-speed internet access and video telephony, in addition to voice calls. Furthermore, a 3G network may be more established and provide larger coverage areas than other network systems. Such multiple access networks may also include code division multiple access (CDMA) systems, time division multiple access (TDMA) systems, frequency division multiple access (FDMA) systems, orthogonal frequency division multiple access (OFDMA) systems, single-carrier FDMA (SC-FDMA) networks, 3rd Generation Partnership Project (3GPP) Long Term Evolution (LTE) networks, and Long Term Evolution Advanced (LTE-A) networks.

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station.

SUMMARY

Certain aspects of the present disclosure generally relate to a current source of a cascode amplifier incorporated into a feedback loop for the amplifier.

Certain aspects of the present disclosure provide a circuit. The circuit generally includes an amplifier, comprising a first transistor and a second transistor connected in cascode with the first transistor. The circuit may also include a buffer coupled to an output of the amplifier and configured to provide feedback to the amplifier and a current source coupled to the second transistor and incorporated into a loop of the feedback to the amplifier.

In certain aspects, the current source comprises a third transistor, and a gate of the third transistor is coupled to the feedback loop. In this case, the buffer may include a source follower having a fourth transistor, a gate of the fourth transistor may be coupled to the output of the amplifier, and a source of the fourth transistor may be coupled to the gate of the third transistor. In certain aspects, the amplifier further comprises a fifth transistor, an input of the amplifier is coupled to a drain of the fifth transistor and to a source of the first transistor, and the feedback to the amplifier is configured to drive a gate of the fifth transistor.

In certain aspects, a source of the first transistor is coupled to an input of the amplifier, and a drain of the first transistor is coupled to a source of the second transistor. The first and second transistors may be connected in a folded cascode architecture. In this case, the first transistor may include an n-channel metal oxide semiconductor field effect (NMOS) transistor, and the second transistor may include a p-channel metal oxide semiconductor field effect (PMOS) transistor.

In certain aspects, the output of the amplifier includes a drain of the second transistor.

In certain aspects, the amplifier comprises a transimpedance amplifier.

Certain aspects of the present disclosure provide a method for processing an input signal. The method generally includes amplifying, via an amplifier, the input signal, wherein the amplifier comprises a first transistor connected in cascode with a second transistor. The method also includes buffering, via a buffer, an output signal of the amplifier to generate a buffered signal and feeding the buffered signal back to the amplifier via a feedback loop, wherein a current source is coupled with the second transistor and incorporated into the feedback loop.

Certain aspects of the present disclosure provide an apparatus for processing an input signal. The apparatus generally includes means for amplifying the input signal, wherein the means for amplifying includes a first transistor connected in cascode with a second transistor; means for buffering an output signal of the means for amplifying to generate a buffered signal, wherein the buffered signal is provided as feedback to the means for amplifying; and means for sourcing current coupled to the second transistor and incorporated into a loop of the feedback to the means for amplifying.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

DETAILED DESCRIPTION

Various aspects of the present disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

The techniques described herein may be used in combination with various wireless technologies such as Code Division Multiple Access (CDMA), Orthogonal Frequency Division Multiplexing (OFDM), Time Division Multiple Access (TDMA), Spatial Division Multiple Access (SDMA), Single Carrier Frequency Division Multiple Access (SC-FDMA), Time Division Synchronous Code Division Multiple Access (TD-SCDMA), and the like. Multiple user terminals can concurrently transmit/receive data via different (1) orthogonal code channels for CDMA, (2) time slots for TDMA, or (3) sub-bands for OFDM. A CDMA system may implement IS-2000, IS-95, IS-856, Wideband-CDMA (W-CDMA), or some other standards. An OFDM system may implement Institute of Electrical and Electronics Engineers (IEEE) 802.11, IEEE 802.16, Long Term Evolution (LTE) (e.g., in TDD and/or FDD modes), or some other standards. A TDMA system may implement Global System for Mobile Communications (GSM) or some other standards. These various standards are known in the art. The techniques described herein may also be implemented in any of various other suitable wireless systems using radio frequency (RF) technology, including Global Navigation Satellite System (GNSS), Bluetooth, IEEE 802.15 (Wireless Personal Area Network (WPAN)), Near Field Communication (NFC), Small Cell, Frequency Modulation (FM), and the like.

An Example Wireless System

Figure 1:
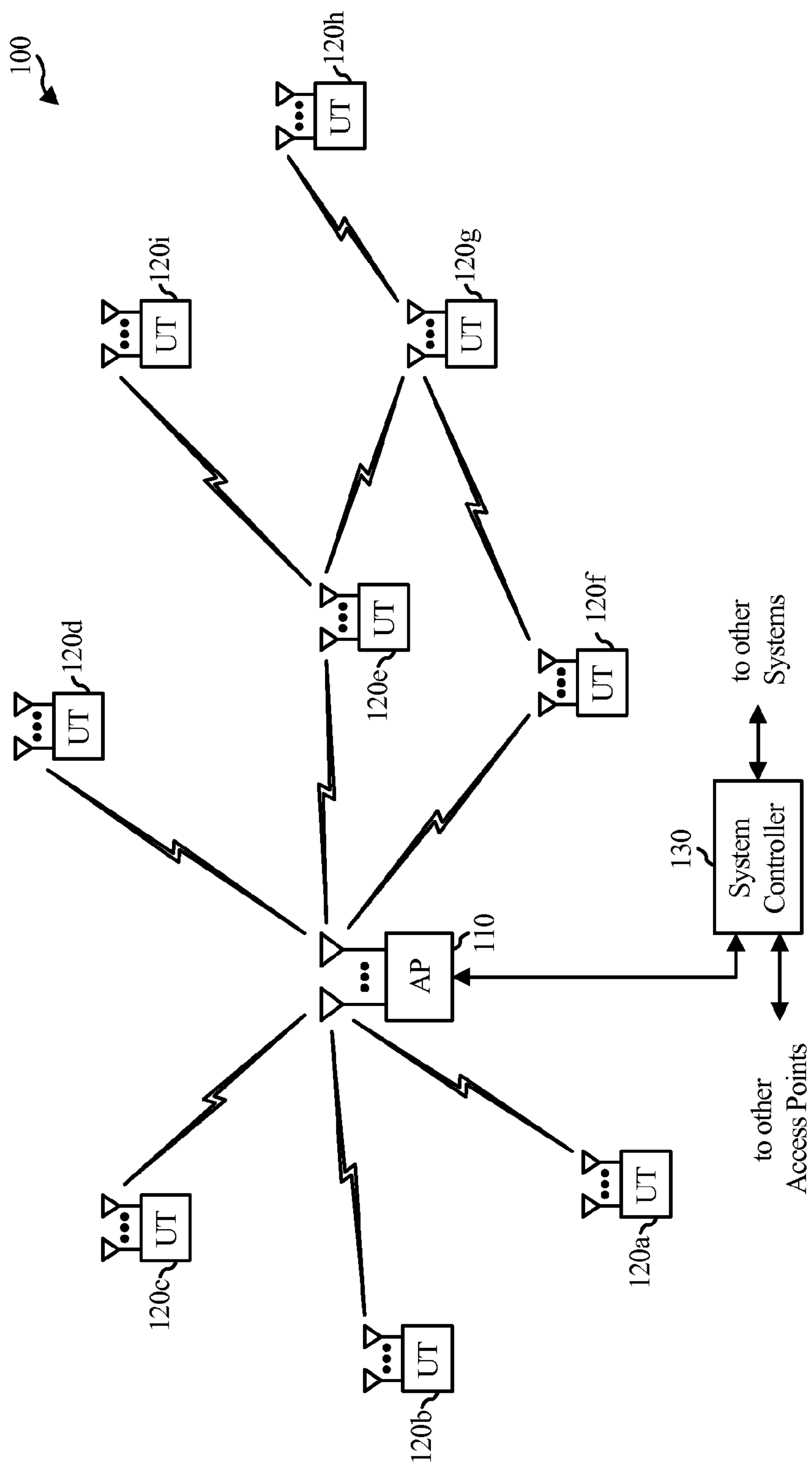
FIG. 1 is a diagram of an example wireless communications network in accordance with certain aspects of the present disclosure.

FIG. 1 illustrates a wireless communications system 100 with access points 110 and user terminals 120. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc. The AP or UT may include a baseband filter (BBF) having an amplifier with a current source incorporated in a feedback loop for the amplifier, in accordance with certain aspects of the present disclosure.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

System 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal 120 may be equipped with one or multiple antennas (i.e., $N_{ut} \geq 1$). The $N_u$ selected user terminals can have the same or different number of antennas.

Wireless system 100 may be a time division duplex (TDD) system or a frequency division duplex (FDD) system. For a TDD system, the downlink and uplink share the same frequency band. For an FDD system, the downlink and uplink use different frequency bands. System 100 may also utilize a single carrier or multiple carriers for transmission. Each user terminal may be equipped with a single antenna (e.g., in order to keep costs down) or multiple antennas (e.g., where the additional cost can be supported).

Figure 2:
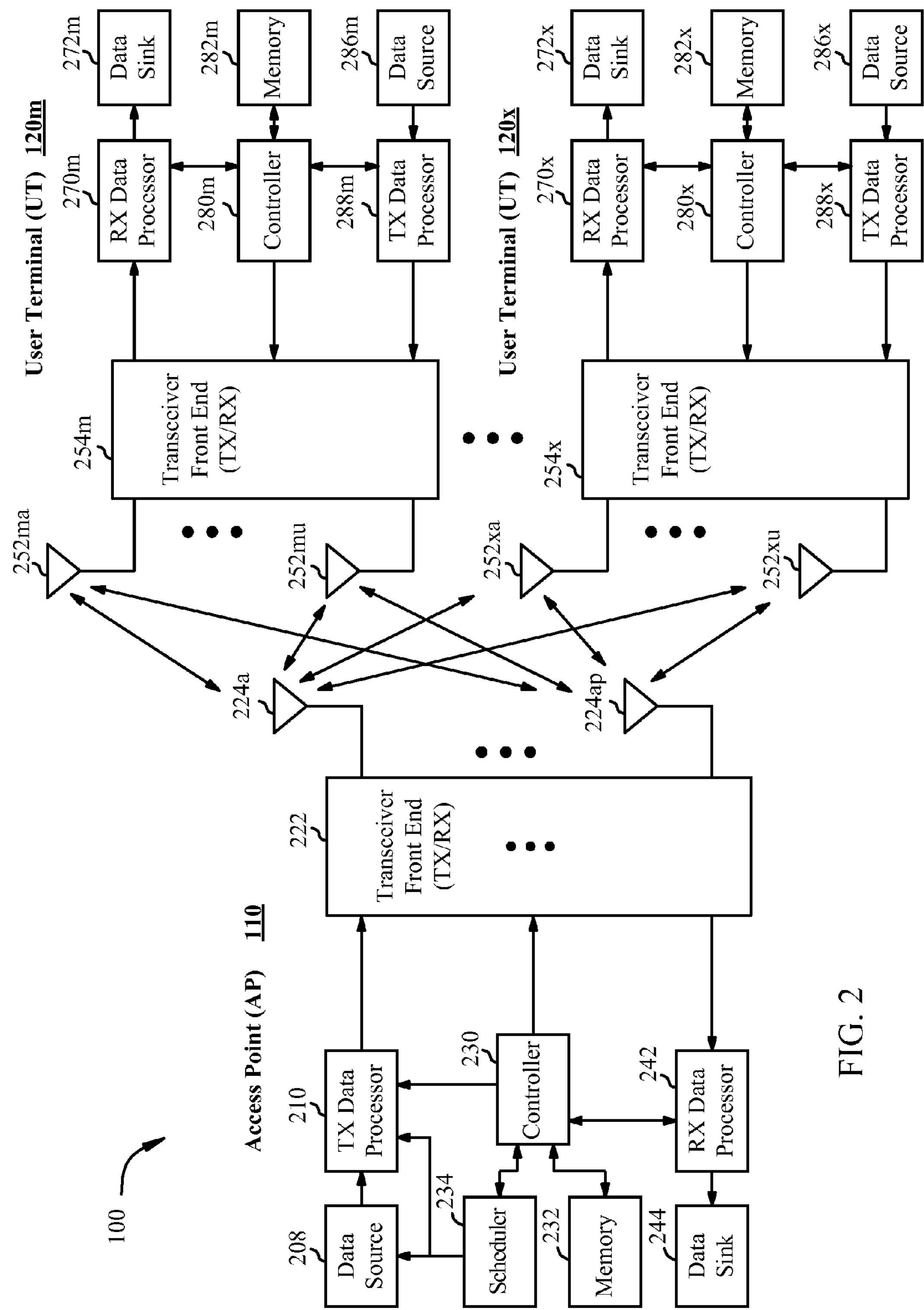
FIG. 2 is a block diagram of an example access point (AP) and example user terminals in accordance with certain aspects of the present disclosure.

FIG. 2 shows a block diagram of access point 110 and two user terminals 120*m* and 120*x* in wireless system 100. Access point 110 is equipped with $N_{ap}$ antennas 224*a* through 224*ap*. User terminal 120*m* is equipped with $N_{ut,m}$ antennas 252*ma* through 252*mu*, and user terminal 120*x* is equipped with $N_{ut,x}$ antennas 252*xa* through 252*xu*. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via an RF switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224*a* through 224*ap* receive the uplink signals from all $N_{up}$ user terminals transmitting on the uplink. For receive diversity, a transceiver front end 222 may select signals received from one of the antennas 224 for processing. For certain aspects of the present disclosure, a combination of the signals received from multiple antennas 224 may be combined for enhanced receive diversity. The access point's transceiver front end 222 also performs processing complementary to that performed by the user terminal's transceiver front end 254 and provides a recovered uplink data symbol stream. The transceiver front end 222 and/or transceiver front end 254 may comprise a BBF having an amplifier with a current source incorporated in a feedback loop for the amplifier, in accordance with certain aspects of the present disclosure. The recovered uplink data symbol stream is an estimate of a data symbol stream $\{s_{up}\}$ transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230

At each user terminal 120, $N_{ut,m}$ antennas 252 receive the downlink signals from access point 110. For receive diversity at the user terminal 120, the transceiver front end 254 may select signals received from one of the antennas 252 for processing. For certain aspects of the present disclosure, a combination of the signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Those skilled in the art will recognize the techniques described herein may be generally applied in systems utilizing any type of multiple access schemes, such as TDMA, SDMA, Orthogonal Frequency Division Multiple Access (OFDMA), CDMA, SC-FDMA, TD-SCDMA, and combinations thereof.

Figure 3:
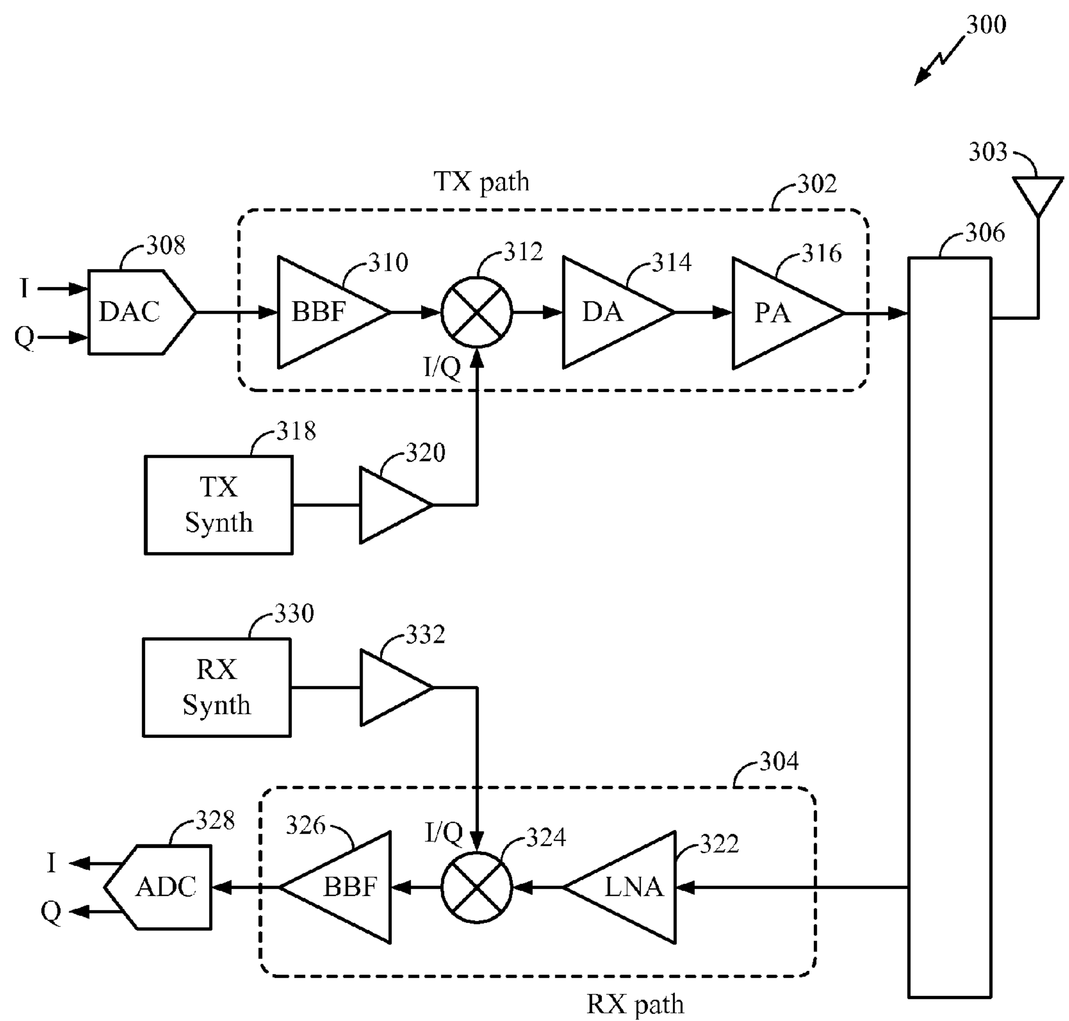
FIG. 3 is a block diagram of an example transceiver front end in accordance with certain aspects of the present disclosure.

FIG. 3 is a block diagram of an example transceiver front end 300, such as transceiver front ends 222, 254 in FIG. 2, in accordance with certain aspects of the present disclosure. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like.

Receiving in-phase (I) or quadrature (Q) baseband analog signals from a digital-to-analog converter (DAC) 308, the TX path 302 may include a BBF 310, a mixer 312, a driver amplifier (DA) 314, and a power amplifier 316. For certain aspects, the BBF 310, the mixer 312, and the DA 314 may be included in a radio frequency integrated circuit (RFIC), while the PA 316 may be external to the RFIC. The BBF 310 may comprise an amplifier with a current source incorporated in a feedback loop of the amplifier, in accordance with certain aspects of the present disclosure. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which are amplified by the DA 314 and by the PA 316 before transmission by the antenna 303.

The RX path 304 includes a low noise amplifier (LNA) 322, a mixer 324, and a BBF 326. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing. The BBF 326 may comprise an amplifier with a current source incorporated in a feedback loop for the amplifier, in accordance with certain aspects of the present disclosure.

While it is desirable for the output of an LO to remain stable in frequency, tuning to different frequencies indicates using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO is typically produced by a TX frequency synthesizer 318, which may be buffered or amplified by amplifier 320 before being mixed with the baseband signals in the mixer 312. Similarly, the receive LO is typically produced by an RX frequency synthesizer 330, which may be buffered or amplified by amplifier 332 before being mixed with the RF signals in the mixer 324.

Example Baseband Filter

A TX baseband filter (BBF), such as the BBF 310 of FIG. 3, typically has stringent adjacent channel leakage ratio (ACLR) design constraints to satisfy out-of-band rejection and forbidden band power ratio (FBPR). The TX BBF may include an amplifier (e.g., a transimpedance amplifier (TIA)) for converting a current provided by a DAC (e.g., a current DAC (IDAC) that converts a digital input to an analog current output) into a voltage that may be mixed (e.g., upconverted) with an LO using a mixer (e.g., mixer 312). The amplifier may use negative feedback to enhance the output impedance of the amplifier; however, the amplifier may not provide sufficient rejection and isolation in order to provide sufficiently low ACLR, especially at higher frequencies. This may be due to the small loop gain at high frequencies, which reduces the effective output resistance and input-to-output isolation of the amplifier (e.g., reducing linearization expected from the negative feedback of the amplifier).

Therefore, what is needed is a BBF having an amplifier with increased linearization and lower ACLR. Aspects of the present disclosure provide apparatus and techniques to increase linearization and loop gain of an amplifier by using a folded cascode amplifier architecture with a PMOS transistor, whose current source load is incorporated into a feedback loop of the amplifier.

Figure 4:
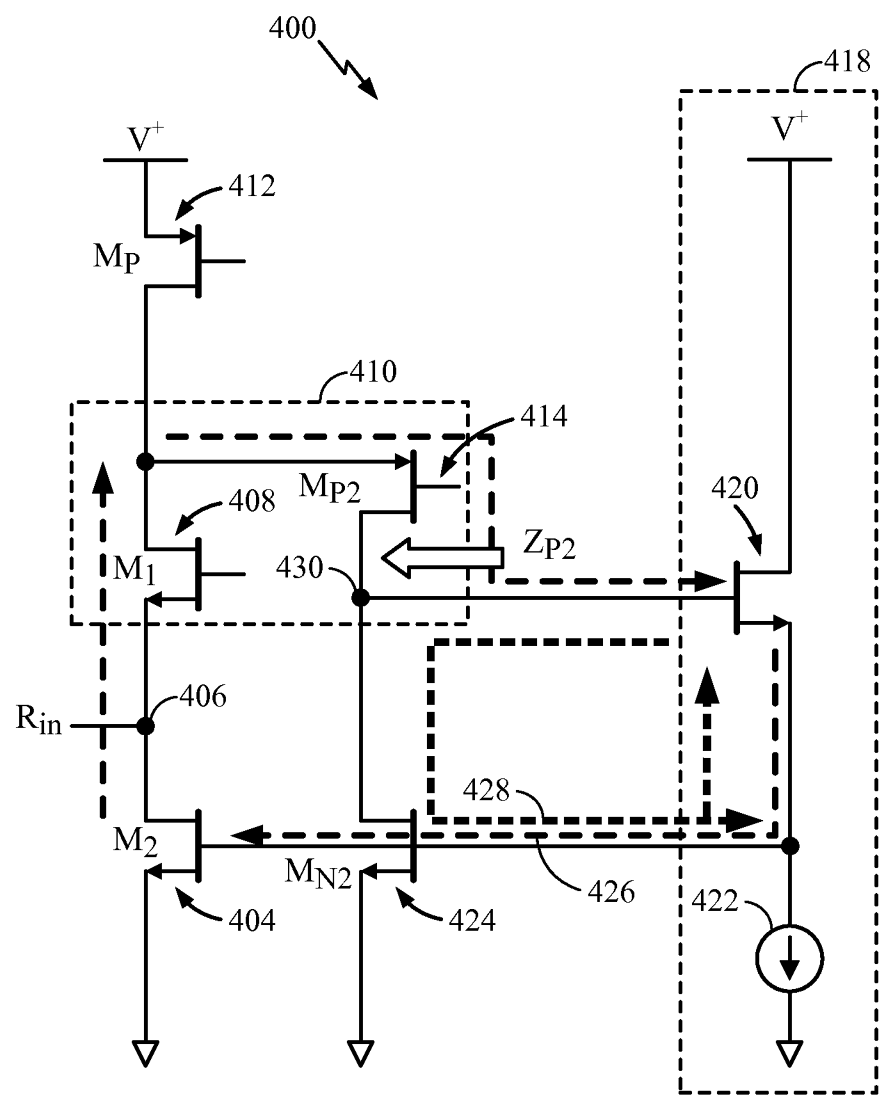
FIG. 4 is a circuit diagram of an example transimpedance amplifier (TIA) having a current source incorporated into a feedback loop of the TIA, in accordance with certain aspects of the present disclosure.

FIG. 4 provides a TIA circuit 400 utilizing a folded cascode amplifier topology having a common gate architecture with negative shunt feedback and a current source that is incorporated into a feedback loop for the amplifier. For example, the circuit 400 may comprise an n-channel metal oxide semiconductor (NMOS) transistor 404 ($M_2$) having a drain coupled to an input node 406 and a source coupled to a reference potential (e.g., electrical ground). A current-based DAC (e.g. DAC 308) may drive the input node 406 through a passive filter, as described below with respect to FIG. 5. A voltage at the input node 406 may result from a drain-to-source voltage drop ($V_{DS}$) of the transistor 404, which may vary relative to the input current from the DAC and a gate voltage of the transistor 404. In certain aspects, the transistor 404 may be replaced with another three-terminal device, such as a voltage-controlled current source or a variable potentiometer.

In addition, the input node 406 is coupled to a folded cascode amplifier 410. The amplifier 410 may comprise an NMOS transistor 408 ($M_1$) in cascode with a PMOS transistor 414 ($M_{P2}$). The PMOS cascode device (e.g., transistor 414) increases the loop gain (and isolation between input/output) by increasing the output resistance seen from node 430 into the drain of PMOS transistor 414.

A gate voltage of the transistor 408 is controlled to bias the transistor 408 to operate in a saturation region. The transistor 408 has a source coupled to the input node 406 and a drain coupled to a source of the transistor 414. The transistor 408 reduces the input impedance and increases the input loop gain at DC. The drain of the PMOS transistor 414 is coupled to an output of the amplifier 410 (node 430). In addition, the circuit 400 comprises a PMOS transistor 412 (biased in the saturation region) having a source coupled with a positive voltage supply ($V^+$) and a drain coupled with a source of the transistor 414 and a drain of the transistor 408. The transistor 412 operates as a current-limiting device between the amplifier 410 and the power supply rail $V^+$. In certain aspects, the transistor 412 may be replaced with a resistor or a current source, for example.

Moreover, the output of the amplifier 410 may be coupled to a buffer 418 to provide isolation between an input and output of the TIA and thus, to provide a low impedance output for the TIA circuit 400. The output of the buffer 418 may be coupled to a gate of the transistor 404 to provide feedback to the amplifier 410 and create feedback loop 426.

In certain aspects, the buffer 418 may be implemented using a source follower circuit, as illustrated in FIG. 4. For example, the source follower may comprise the NMOS transistor 420 having a drain coupled to a positive voltage supply rail (e.g., V) and a source (e.g., output of the buffer 418) coupled to a current source 422. The source of the transistor 420 may also be coupled to a gate of the transistor 404. The source follower facilitates the feedback loop 426 maintaining loop gain over a frequency band of interest. Moreover, the source follower increases drive capability of the TIA. That is, the source follower increases the power output capability of the TIA and, as a result, increases the operating bandwidth (BW) of the TIA even with a large load (e.g., high current demand at the output of the TIA). While the buffer 418 illustrated in FIG. 4 is implemented with a source follower, those skilled in the art will appreciate that the buffer 418 may comprise other circuits.

According to certain aspects of the present disclosure, the output of the folded cascode amplifier 410 may be coupled to a current source (e.g., NMOS transistor 424 ($M_{N2}$)), which may be controlled by an output of the buffer 418. That is, a drain of the NMOS transistor 424 may be coupled to the output of the amplifier 410, and a source of the NMOS transistor 424 may be coupled to a reference potential. The output of the buffer 418 may be coupled to a gate of the transistor 424, thereby creating a second feedback loop 428.

By including a current source (e.g., transistor 424) incorporated into the feedback loop for the TIA, the feedback loop BW of the TIA may be increased compared to conventional TIA topologies. For example, in a case where the output of the amplifier 410 is coupled with a current source (e.g., a constant current source, not shown) that is not incorporated in the feedback loop for the circuit 400 (e.g., is not controlled by the output of the buffer 418), the feedback loop BW may be limited due to the high impedance $Z_{P2}$ at the drain of transistor 414.

That is, the load impedance may be determined by an impedance at the drain of the PMOS transistor 412 and drain of the transconductance NMOS transistor 408. To keep the NMOS transistor 404 in saturation, the buffer 418 (formed by source follower NMOS transistor 420 and current source 422) is configured to drive the gate of the NMOS 404. However, the NMOS transistor 420 may be relatively large in order to provide strong transconductance, allow for lower overdrive voltage and not introduce a pole in the frequency response of the TIA for the feedback loop 426. Therefore, a large capacitance may be introduced at node 430 by the NMOS transistor 420. This large capacitance and the high impedance at node 430 may introduce a low frequency pole to the feedback loop 426 (e.g., formed by the common-gate amplifier 410 and source follower 418). This parasitic pole frequency ($f_P$) may be determined in accordance with the following equation:

$$f_P = \frac{1}{2\pi RC} \tag{1}$$

where R is the impedance at node 430 and C is the capacitance at the node 430. Therefore, with the large capacitance and impedance at node 430, the parasitic pole frequency may fall in a low frequency band and reduce the loop gain bandwidth.

In this unincorporated case, an impedance $Z_{P2}$ may be calculated in accordance with the following equation:

$$Z_{p2} \approx R_{o,p2} \| r_{current\_source} \approx r_{0,p2} \tag{2}$$

where $R_{o,p2}$ is the output resistance seen from node 430 into transistor 414 and $r_{current\_source}$ is the resistance across the unincorporated current source (not shown). Moreover, $R_{o,p2}$ can be roughly represented by the following equation:

$$g_{m,p2} \times r_{o,p2}(r_{o,n1} \| r_{o,p0}) \tag{3}$$

where $g_{m,p2}$ is the transconductance of transistor 414, $r_{o,p2}$ is the output resistance of transistor 414, $r_{o,n1}$ is the output resistance of the NMOS transistor 408, and $r_{o,p0}$ is the output resistance of the PMOS transistor 412.

Higher impedance $Z_{P2}$ at the output of the amplifier 410 results in lower BW for the feedback loop 426. That is, a TIA having high feedback loop impedance may not adequately compensate for fast changes in voltage that may be experienced at higher frequencies (e.g., may be unable to charge and discharge internal capacitance of transistor 420). In otherwords, the loop gain may drop significantly at high frequency, and linearity and ACLR suffer. One solution entails substantially increasing the power consumption in an effort to increase the loop bandwidth, but this solution may be unattractive, especially given portable battery-operated devices.

Certain aspects of the present disclosure include a current source (e.g., transistor 424) that is incorporated into the feedback loop of the amplifier (and may be controlled by the output of the buffer 418, for example). By including transistor 424 in the feedback loop in an effort to lower the impedance $Z_{P2}$, a resulting pole of the frequency response of the TIA can be pushed to a higher frequency and, as a result, increase the BW of the feedback loop 426. That is, including the folded cascode current source inside the feedback loop lowers the impedance $Z_{P2}$ seen from the drain of transistor 414 and pushes the resulting pole of the frequency response for the TIA to a higher frequency. This leads to increased loop bandwidth and reduced ACLR.

Therefore, the impedance $Z_{P2}$ of circuit 400 as illustrated in FIG. 4 with feedback loop 428 may be represented in accordance with the following equation:

$$Z_{p2} \approx \frac{R_{o,p2} \| r_{current\_source}}{1 + loopgain} << r_{0,P2} \tag{4}$$

where loopgain is the gain of the feedback loop 428. As demonstrated by Equation 4, the impedance $Z_{P2}$ is much lower than $r_{0,P2}$, in contrast with Equation 2 where $Z_{P2}$ is roughly equal to $r_{0,P2}$. As shown in Equation 4, $Z_{P2}$ may be reduced by a factor of 1+loopgain.

Large direct current (DC) loop gain and bandwidth (BW) due to the use of a folded cascode device are beneficial in isolating the input and output filter poles of the BBF, as well as making the filter poles less sensitive to transistor size and variations in process, voltage, and temperature (PVT). Therefore, the baseband filter performance can be maintained across PVT by tuning a resistance or capacitance of the filter.

Figure 5:
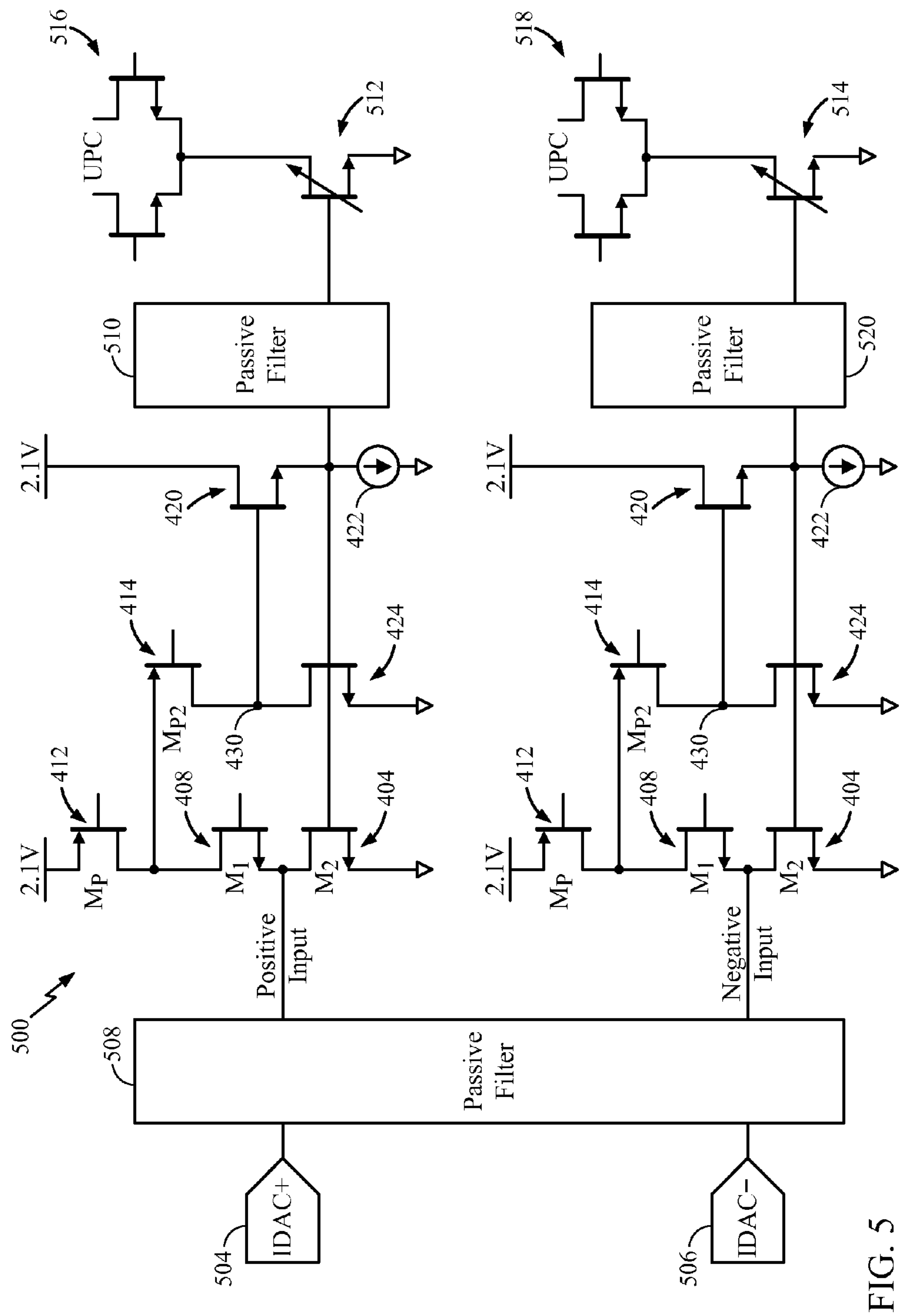
FIG. 5 is a circuit diagram of an example transmitter (TX) baseband filter (BBF) circuit using the circuit diagram of FIG. 4, in accordance with certain aspects of the present disclosure.

In certain aspects of the present disclosure, the current DAC (IDAC) may have a differential output with a positive terminal 504 (IDAC+) and a negative terminal 506 (IDAC−). FIG. 5 illustrates a first portion 500 of a differential transmit (TX) path and a second portion 502 of the TX path (complementary to the first portion), both portions 500, 502 employing the TIA circuit 400 of FIG. 4. A signal from the positive terminal 504 (IDAC+) may be filtered via a passive filter 508 to generate the positive input to the first portion 500. The output of the first portion 500 may be filtered via a passive filter 510 to drive a gate of an NMOS transistor 512. The transistors 404 and 512 form a current mirror, which copies the IDAC current to a TX upconverter (UPC) 516. In certain aspects, the negative terminal 506 (IDAC−) may be coupled to a passive filter 508, the second portion 502, a passive filter 520, an NMOS transistor 514, and a UPC 518, in a similar fashion.

Figure 6:
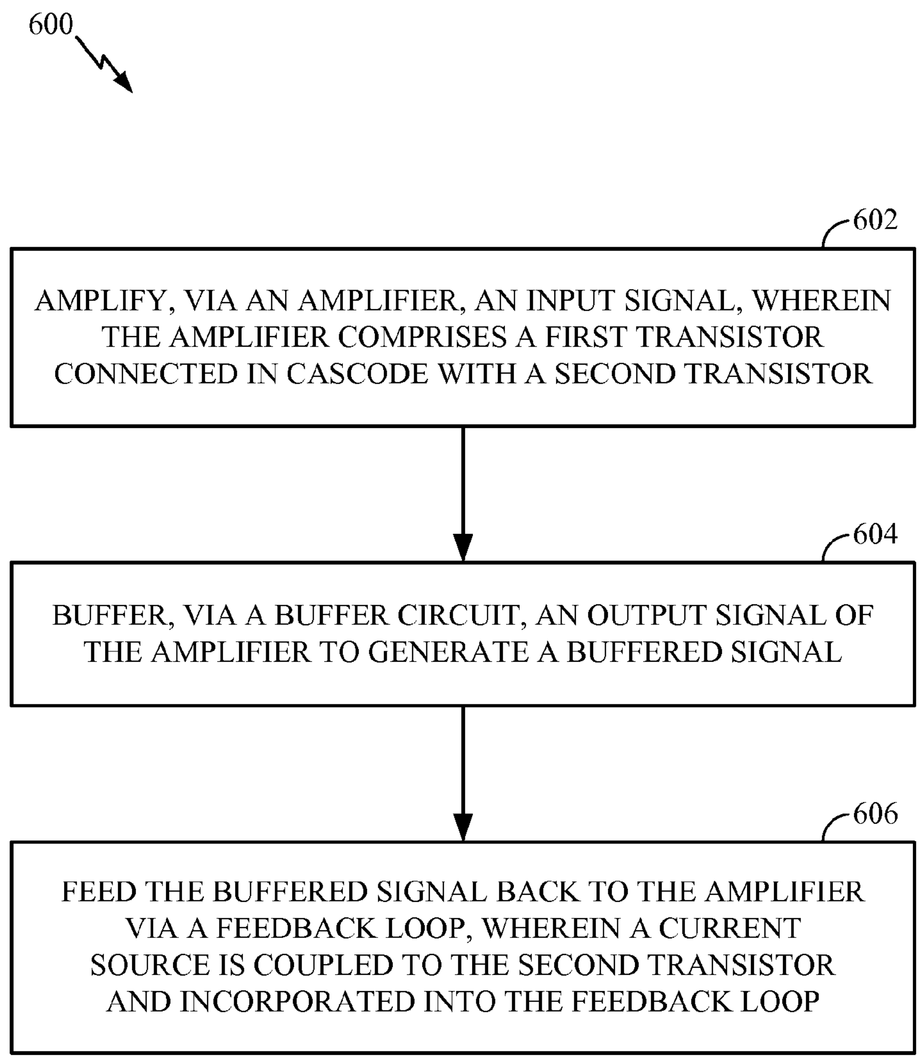
FIG. 6 is a flow diagram of example operations for processing an input signal, in accordance with certain aspects of the present disclosure.

FIG. 6 is a flow diagram of example operations 600 for processing an input signal, in accordance with certain aspects of the present disclosure. The operations 600 may be performed by a circuit, such as the TIA circuit 400 in FIG. 4 described above.

The operations 600 may begin, at block 602, with the circuit amplifying, via an amplifier (e.g., amplifier 410, which may be a TIA), an input signal (e.g., at node 406). The amplifier comprises a first transistor (e.g., transistor 408) connected in cascode with a second transistor (e.g., transistor 414). At block 604, the circuit may buffer, via a buffer (e.g., buffer 418), an output signal of the amplifier to generate a buffered signal.

At block 606, the circuit may feed the buffered signal back to the amplifier via a feedback loop (e.g., loop 426). A current source (e.g., NMOS transistor 424) is coupled to the second transistor and incorporated into the feedback loop (and may form another loop, such as loop 428).

According to certain aspects, the current source may include a third transistor, and a gate of the third transistor may be coupled to the feedback loop. In certain aspects, the buffer may include a source follower having a fourth transistor. In this case, a gate of the fourth transistor may be coupled to an output node of the amplifier, and source of the fourth transistor may be coupled to the gate of the third transistor. For certain aspects, the amplifier may include a fifth transistor. In this case, an input node of the amplifier may be coupled to a drain of the fifth transistor and to a source of the first transistor. Feeding the buffered signal back to the amplifier at block 606 may entail driving a gate of the fifth transistor.

According to certain aspects, a source of the first transistor may be coupled to an input node of the amplifier. In this case, a drain of the first transistor may be coupled to a source of the second transistor. In certain aspects, the first and second transistors may be connected in a folded cascode architecture. The first transistor may include an NMOS transistor, and the second transistor may include a PMOS transistor.

CONCLUSION

Aspects of the present disclosure provide an amplifier (e.g., for a BBF) having a folded cascode amplifier architecture with a current source incorporated in a feedback loop for the amplifier. Doing so reduces the impedance seen at the drain of the PMOS cascode device (e.g., transistor 414), hence pushing a pole of the amplifier to higher frequencies, resulting in higher loop bandwidth. Moreover, aspects of the present disclosure decrease mismatch that may be caused by PVT variations in current sources of the feedback loops (e.g., loops 426 and 428).

The various operations or methods described above may be performed by any suitable means capable of performing the corresponding functions. The means may include various hardware and/or software component(s) and/or module (s), including, but not limited to a circuit, an application specific integrated circuit (ASIC), or processor. Generally, where there are operations illustrated in figures, those operations may have corresponding counterpart means-plus-function components with similar numbering.

For example, means for transmitting may comprise a transmitter (e.g., the transceiver front end 254 of the user terminal 120 depicted in FIG. 2 or the transceiver front end 222 of the access point 110 shown in FIG. 2) and/or an antenna (e.g., the antennas 252*ma* through 252*mu* of the user terminal 120*m* portrayed in FIG. 2 or the antennas 224*a* through 224*ap* of the access point 110 illustrated in FIG. 2). Means for receiving may comprise a receiver (e.g., the transceiver front end 254 of the user terminal 120 depicted in FIG. 2 or the transceiver front end 222 of the access point 110 shown in FIG. 2) and/or an antenna (e.g., the antennas 252*ma* through 252*mu* of the user terminal 120*m* portrayed in FIG. 2 or the antennas 224*a* through 224*ap* of the access point 110 illustrated in FIG. 2). Means for processing or means for determining may comprise a processing system, which may include one or more processors, such as the RX data processor 270, the TX data processor 288, and/or the controller 280 of the user terminal 120 illustrated in FIG. 2. Means for amplifying may comprise an amplifier, such as the amplifier 410 or a circuit comprising cascode-connected transistors 408 and 414 depicted in FIG. 4. Means for buffering may be performed by a buffer, such as buffer 418, or a source follower circuit, such as the transistor 420 shown in FIG. 4. Means for sourcing current may comprise a current source, such as the NMOS transistor 424 illustrated in FIG. 4.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above.

Various modifications, changes and variations may be made in the arrangement, operation and details of the methods and apparatus described above without departing from the scope of the claims.

What is claimed is:

1. A circuit comprising:
an amplifier comprising:
a first transistor; and
a second transistor connected in cascode with the first transistor, wherein a source of the first transistor is coupled to an input of the amplifier and wherein a drain of the first transistor is coupled to a source of the second transistor;
a buffer coupled to an output of the amplifier and configured to provide feedback to the amplifier; and
a current source coupled to the second transistor and incorporated into a loop of the feedback to the amplifier.

2. The circuit of claim 1, wherein the current source comprises a third transistor and wherein a gate of the third transistor is coupled to the loop of the feedback.

3. The circuit of claim 2, wherein the buffer comprises a source follower having a fourth transistor, wherein a gate of the fourth transistor is coupled to the output of the amplifier, and wherein a source of the fourth transistor is coupled to the gate of the third transistor.

4. The circuit of claim 3, wherein the amplifier further comprises a fifth transistor, wherein the input of the amplifier is coupled to a drain of the fifth transistor and to the source of the first transistor, and wherein the feedback to the amplifier is configured to drive a gate of the fifth transistor.

5. The circuit of claim 1, wherein the first and second transistors are connected in a folded cascode architecture, wherein the first transistor comprises an n-channel metal oxide semiconductor field effect (NMOS) transistor, and wherein the second transistor comprises a p-channel metal oxide semiconductor field effect (PMOS) transistor.

6. The circuit of claim 1, wherein the output of the amplifier comprises a drain of the second transistor.

7. The circuit of claim 1, wherein the amplifier comprises a transimpedance amplifier.

8. The circuit of claim 1, further comprising a first passive filter coupled with the input of the amplifier and a second passive filter coupled with an output of the buffer.

9. A method for processing an input signal, comprising:
amplifying, via an amplifier, the input signal, wherein the amplifier comprises a first transistor connected in cascode with a second transistor, wherein a source of the first transistor is coupled to an input node of the amplifier, and wherein a drain of the first transistor is coupled to a source of the second transistor;
buffering, via a buffer, an output signal of the amplifier to generate a buffered signal; and
feeding the buffered signal back to the amplifier via a feedback loop, wherein a current source is coupled to the second transistor and incorporated into the feedback loop.

10. The method of claim 9, wherein the current source comprises a third transistor and wherein a gate of the third transistor is coupled to the feedback loop.

11. The method of claim 10, wherein the buffer comprises a source follower having a fourth transistor, wherein a gate of the fourth transistor is coupled to an output node of the amplifier, and wherein a source of the fourth transistor is coupled to the gate of the third transistor.

12. The method of claim 11, wherein the amplifier further comprises a fifth transistor, wherein the input node of the amplifier is coupled to a drain of the fifth transistor and to the source of the first transistor, and wherein feeding the buffered signal back to the amplifier comprises driving a gate of the fifth transistor.

13. The method of claim 9, wherein the first and second transistors are connected in a folded cascode architecture, wherein the first transistor comprises an n-channel metal oxide semiconductor field effect (NMOS) transistor, and wherein the second transistor comprises a p-channel metal oxide semiconductor field effect (PMOS) transistor.

14. The method of claim 9, wherein the output signal of the amplifier is generated at a drain of the second transistor.

15. The method of claim 9, wherein the amplifier comprises a transimpedance amplifier.

16. An apparatus for processing an input signal, comprising:
means for amplifying the input signal, wherein the means for amplifying comprises a first transistor connected in cascode with a second transistor, wherein a source of the first transistor is coupled to an input node of the means for amplifying and wherein a drain of the first transistor is coupled to a source of the second transistor;
means for buffering an output signal of the means for amplifying to generate a buffered signal, wherein the buffered signal is provided as feedback to the means for amplifying; and
means for sourcing current coupled to the second transistor and incorporated into a loop of the feedback to the means for amplifying.

17. The apparatus of claim 16, wherein the means for sourcing current comprises a third transistor and wherein a gate of the third transistor is driven by the buffered signal.

18. The apparatus of claim 17, wherein the means for buffering comprises a source follower having a fourth transistor, wherein a gate of the fourth transistor is coupled to an output node of the means for amplifying, and wherein a source of the fourth transistor is coupled to the gate of the third transistor.

* * * * *